(12) United States Patent
Huang et al.

(10) Patent No.: US 10,304,521 B2
(45) Date of Patent: May 28, 2019

(54) MEMORY CONTROL CIRCUIT UNIT, MEMORY STORAGE DEVICE AND SIGNAL RECEIVING METHOD

(71) Applicant: PHISON ELECTRONICS CORP., Miaoli (TW)

(72) Inventors: Ming-Chien Huang, Hsinchu (TW); Chia-Lung Ma, New Taipei (TW); Tzu-Chia Huang, New Taipei (TW)

(73) Assignee: PHISON ELECTRONICS CORP., Miaoli (TW)

( * ) Notice: Subject to any disclaimer, the term of this patent is extended or adjusted under 35 U.S.C. 154(b) by 0 days.

(21) Appl. No.: 15/955,701

(22) Filed: Apr. 18, 2018

(65) Prior Publication Data

US 2018/0233191 A1    Aug. 16, 2018

Related U.S. Application Data

(63) Continuation of application No. 15/591,114, filed on May 10, 2017, now Pat. No. 9,990,983, which is a
(Continued)

(30) Foreign Application Priority Data

Jun. 20, 2016  (TW) ............................. 105119349 A
Mar. 9, 2017   (TW) ............................. 106107658 A (51) Int. Cl.
| G11C 5/14     | (2006.01) |
| G11C 11/4093  | (2006.01) |
| G11C 11/4099  | (2006.01) |
| G11C 11/4096  | (2006.01) |
| G11C 11/4074  | (2006.01) |

(Continued)

(52) U.S. Cl.
CPC .......... *G11C 11/4093* (2013.01); *G06F 12/00* (2013.01); *G06F 13/16* (2013.01); *G11C 5/147* (2013.01); *G11C 7/1084* (2013.01); *G11C 11/005* (2013.01); *G11C 11/4074* (2013.01); *G11C 11/4096* (2013.01); *G11C 11/4099* (2013.01); *G11C 2207/10* (2013.01)

(58) Field of Classification Search
CPC ................................. G11C 5/147; G11C 16/30
USPC ............................................ 365/189.09, 226
See application file for complete search history.

(56) References Cited

U.S. PATENT DOCUMENTS 7,548,087 B2 *  6/2009  Kuroki ................. G11C 7/1048
                                                      326/26
8,611,844 B2 * 12/2013  Su ............................ H04B 1/18
                                                      455/277.1

(Continued)

*Primary Examiner* — Michael T Tran
(74) *Attorney, Agent, or Firm* — JCIPRNET (57) ABSTRACT

A memory control circuit unit, a memory storage device and a signal receiving method. In one exemplary embodiment, a memory interface circuit of the memory control circuit unit receives a first signal from a volatile memory and adjusts a voltage value of the first signal to a voltage range in response to an internal impedance of the memory interface circuit, where a central value of the voltage range is not equal to a default voltage value, and the default voltage value is one half a sum of a voltage value of a supply voltage of the memory interface circuit and a voltage value of a reference ground voltage. In addition, the memory interface circuit further generates an input signal according to a voltage correspondence between the first signal and an internal reference voltage.

25 Claims, 5 Drawing Sheets

Related U.S. Application Data continuation-in-part of application No. 15/241,094, filed on Aug. 19, 2016, now Pat. No. 9,685,221.

(51) Int. Cl.
*G06F 13/16* (2006.01)
*G11C 7/10* (2006.01)
*G11C 11/00* (2006.01)
*G06F 12/00* (2006.01)

(56) References Cited

U.S. PATENT DOCUMENTS

| | | | | |
|---|---|---|---|---|
| 8,817,558 | B2* | 8/2014 | Fujisawa | G11C 11/40615 365/194 |
| 8,878,564 | B2* | 11/2014 | Araki | H03K 19/00369 324/108 |
| 9,001,448 | B2* | 4/2015 | Dean | G11B 5/02 360/31 |
| 9,054,916 | B1* | 6/2015 | Nguyen | H03K 3/012 |
| 9,166,640 | B2* | 10/2015 | Bakalski | H03H 7/40 |
| 9,183,901 | B2* | 11/2015 | Kim | G11C 5/063 |
| 9,305,193 | B2* | 4/2016 | Lee | G06K 7/10158 |
| 9,484,075 | B2* | 11/2016 | Arai | H03K 19/0175 |
| 9,545,212 | B2* | 1/2017 | Kim | A61B 5/0408 |
| 9,570,122 | B2* | 2/2017 | Fujisawa | G11C 7/1048 |
| 9,734,783 | B2* | 8/2017 | Yu | G09G 3/3648 |
| 10,165,358 | B2* | 12/2018 | Koudar | G01S 7/524 |

\* cited by examiner

MEMORY CONTROL CIRCUIT UNIT, MEMORY STORAGE DEVICE AND SIGNAL RECEIVING METHOD

CROSS-REFERENCE TO RELATED APPLICATION

This application is a continuation application of and claims the priority benefit of U.S. application Ser. No. 15/591,114, filed on May 10, 2017, now allowed. The U.S. application Ser. No. 15/591,114 is a continuation-in-part application of and claims the priority benefit of a prior application Ser. No. 15/241,094, filed on Aug. 19, 2016, U.S. Pat. No. 9,685,221, which claims the priority benefit of Taiwan application serial no. 105119349, filed on Jun. 20, 2016. This continuation-in-part application also claims the priority benefit of Taiwan application serial no. 106107658, filed on Mar. 9, 2017. The entirety of each of the above-mentioned patent applications is hereby incorporated by reference herein and made a part of this specification.

BACKGROUND

Technical Field

The disclosure relates to a signal receiving technique, and more particularly, to a memory control circuit unit, a memory storage device and a signal receiving method.

Description of Related Art

The markets of digital cameras, cellular phones, and MP3 players have expanded rapidly in recent years, resulting in escalated demand for storage media by consumers. The characteristics of data non-volatility, low power consumption, and compact size make a rewritable non-volatile memory module (e.g., flash memory) ideal to be built in the portable multi-media devices as cited above.

In certain types of storage devices, a rewritable non-volatile memory module and a volatile memory such as DRAM (Dynamic random access memory) are both disposed to provide long term storage as well as temporarily buffering for data. In the storage device disposed with the volatile memory, a memory interface circuit serving as a signal receiver of the volatile memory is normally disposed with a termination resistor for maintaining a signal quality of a high-speed signal from the volatile memory. However, existence of the termination resistor also means higher power consumption for the signal receiver.

Nothing herein should be construed as an admission of knowledge in the prior art of any portion of the present disclosure. Furthermore, citation or identification of any document in this application is not an admission that such document is available as prior art to the present disclosure, or that any reference forms a part of the common general knowledge in the art.

SUMMARY

The disclosure is directed to a memory control circuit unit, a memory storage device and a signal receiving method, capable of reducing a power consumption of a memory interface circuit if receiving signals from a volatile memory.

An exemplary embodiment of the disclosure provides a memory control circuit unit, which is configured to control a volatile memory. The memory control circuit unit comprises a memory controller and a memory interface circuit. The memory interface circuit is coupled to the memory controller. The memory interface circuit is configured to receive a first signal from the volatile memory. The memory interface circuit is further configured to adjust a voltage value of the first signal to a voltage range in response to an internal impedance of the memory interface circuit. The memory interface circuit is further configured to generate an input signal according to a voltage correspondence between the first signal and an internal reference voltage. The memory interface circuit comprises a first impedance component and a second impedance component configured to provide the internal impedance. The memory interface circuit is further configured to act based on a first mode if the first impedance component is activated and the second impedance component is not activated. The memory interface circuit is further configured to act based on a second mode if the first impedance component is activated and the second impedance component is activated. A voltage value of the internal reference voltage which is used if the memory interface circuit is acted based on the first mode does not equal to a first voltage value. The first voltage value is a voltage value of the internal reference voltage which is used if the memory interface circuit is acted based on the second mode.

Another exemplary embodiment of the disclosure provides a memory storage device, which includes a connection interface unit, a rewritable non-volatile memory module, a volatile memory and a memory control circuit unit. The connection interface unit is configured to couple to a host system. The memory control circuit unit is coupled to the connection interface unit, the rewritable non-volatile memory module and the volatile memory. The memory control circuit unit is configured to receive a first signal from the volatile memory. The memory control circuit unit is further configured to adjust a voltage value of the first signal to a voltage range in response to an internal impedance of the memory control circuit unit. The memory control circuit unit is further configured to generate an input signal according to a voltage correspondence between the first signal and an internal reference voltage. The memory control circuit unit comprises a first impedance component and a second impedance component configured to provide the internal impedance. The memory control circuit unit is further configured to act based on a first mode if the first impedance component is activated and the second impedance component is not activated. The memory control circuit unit is further configured to act based on a second mode if the first impedance component is activated and the second impedance component is activated. A voltage value of the internal reference voltage which is used if the memory control circuit unit is acted based on the first mode does not equal to a first voltage value. The first voltage value is a voltage value of the internal reference voltage which is used if the memory control circuit unit is acted based on the second mode.

Another exemplary embodiment of the disclosure provides a signal receiving method for a memory storage device having a volatile memory. The signal receiving method includes: receiving a first signal from the volatile memory by a memory interface circuit; adjusting a voltage value of the first signal to a voltage range in response to an internal impedance of the memory interface circuit; generating an input signal according to a voltage correspondence between the first signal and an internal reference voltage; operating the memory interface circuit based on a first mode if a first impedance component of the memory interface circuit is activated and a second impedance component of the memory interface circuit is not activated; and operating the memory interface circuit based on a second mode if the first impedance component is activated and the second impedance component is activated. A voltage value of the internal reference voltage which is used if the memory interface circuit is operated based on the first mode does not equal to a first voltage value. The first voltage value is a voltage value of the internal reference voltage which is used if the memory interface circuit is operated based on the second mode.

Based on the above, the disclosure proposes a specific receiver circuit to be disposed in the memory interface circuit for adjusting the voltage value of the first signal from the volatile memory to the voltage range and using a suitable internal reference voltage to analyze the first signal. As a result, correctness of the generated input signal can be maintained while reducing the power consumption if receiving the first signal.

To make the above features and advantages of the disclosure more comprehensible, several embodiments accompanied with drawings are described in detail as follows.

It should be understood, however, that this Summary may not contain all of the aspects and embodiments of the present disclosure, is not meant to be limiting or restrictive in any manner, and that the disclosure as disclosed herein is and will be understood by those of ordinary skill in the art to encompass obvious improvements and modifications thereto.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Reference will now be made in detail to the present preferred embodiments of the disclosure, examples of which are illustrated in the accompanying drawings. Wherever possible, the same reference numbers are used in the drawings and the description to refer to the same or like parts.

Embodiments of the present disclosure may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Exemplary embodiments are provided below to describe the disclosure in detail, though the disclosure is not limited to the provided exemplary embodiments, and the provided exemplary embodiments can be suitably combined. The term "coupling/coupled" used in this specification (including claims) may refer to any direct or indirect connection means. For example, "a first device is coupled to a second device" should be interpreted as "the first device is directly connected to the second device" or "the first device is indirectly connected to the second device through other devices or connection means." In addition, the term "signal" can mean a current, a voltage, a charge, a temperature, data or any one or multiple signals.

Figure 1:
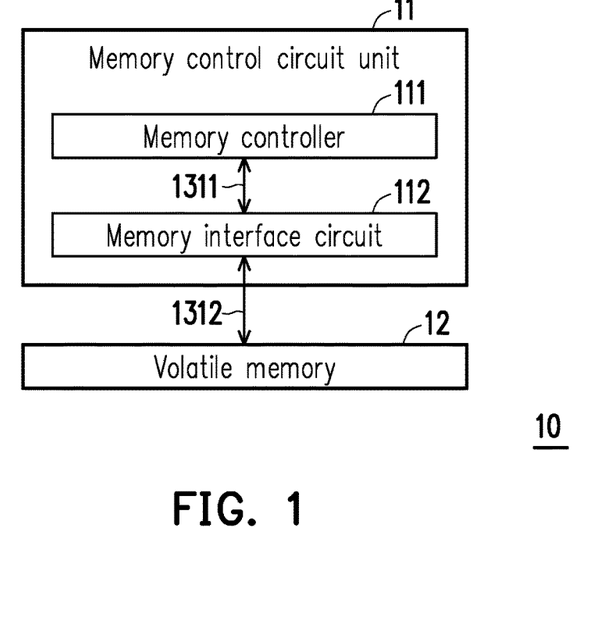
FIG. 1 is a schematic diagram illustrating a memory storage device according to an exemplary embodiment of the disclosure.

FIG. 1 is a schematic diagram illustrating a memory storage device according to an exemplary embodiment of the disclosure. With reference to FIG. 1, a memory storage device 10 includes a memory control circuit unit 11 and a volatile memory 12. The memory control circuit unit 11 may be packaged into one chip or composed of electronic circuits distributed on at least one circuit board. In the present exemplary embodiment, the volatile memory 12 is a Double Data Rate 4 Synchronous Dynamic Random Access Memory (DDR 4 SDRAM). In another exemplary embodiment, the volatile memory 12 may also be a volatile memory of other type, such as a DDR 3 SDRAM. Also, a total quantity of the volatile memory 12 may be one or more.

The memory control circuit unit 11 and the volatile memory 12 are installed on one or more circuit boards in the memory storage device 10. The memory control circuit unit 11 can assist a data access operation for the volatile memory 12. In an exemplary embodiment, the memory control circuit unit 11 is regarded as a control chip of the volatile memory 12, and the volatile memory 12 is regarded as a cache memory or a buffer memory of the memory control circuit unit 11.

The memory control circuit unit 11 includes a memory controller 111 and a memory interface circuit 112. The memory controller 111 is coupled to the memory interface circuit 112. The memory controller 111 is configured to control the volatile memory 12. In the present exemplar embodiment, the memory controller 111 is also known as a DRAM (dynamic random access memory) controller.

The memory interface circuit 112 is configured to connect the memory controller 111 to the volatile memory 12. If intending to read data from the volatile memory 12 or store data into the volatile memory 12, the memory controller 111 sends a command sequence to the volatile memory 12 via the memory interface circuit 112. If such command sequence is received by the volatile memory 12, the volatile memory 12 stores a write-data corresponding to the command sequence or transmits a read-data corresponding to the command sequence back to the memory controller 111 via the memory interface circuit 112. Further, in the memory interface circuit 112, the write-data and the read-data are transmitted in form of a data signal. For example, the data signal can be used to transmit bit data including a bit "1" and a bit "0".

In the present exemplary embodiment, because the volatile memory 12 is DDR SDRAM, a rising edge and a falling edge of a clock signal of the memory interface circuit 112 can both be used to analyze (e.g., sample) the data signal from the volatile memory 12. In other words, within a clock cycle, the memory interface circuit 112 can perform data writing or reading on the volatile memory 12 for twice.

In the present exemplary embodiment, the memory interface circuit 112 is compatible with a SSTL (Stub Series Terminated Logic) I/O standard, such as SSTL-2, SSTL-3, SSTL-15 or SSTL-18. In the present exemplary embodiment, the memory interface circuit 112 includes a connection interface 1311 (a.k.a. a first connection interface) and a connection interface 1312 (a.k.a. a second connection interface). The connection interface 1311 is configured to connect the memory controller 111 with the memory interface circuit 112, and the connection interface 1312 is configured to connect the memory interface circuit 112 with the volatile memory 12. In the present exemplary embodiment, the connection interface 1312 includes a plurality of conductive pins. The memory interface circuit 112 is connected to the volatile memory 12 through these conductive pins. In the present exemplary embodiment, these conductive pins at least include one pin for transmitting the data signal (a.k.a. a data pin). For example, the data pin may be a DQ pin. Accordingly, the data signal can be transmitted between the memory interface circuit 112 and the volatile memory 12 via the data pin. In another exemplary embodiment, these conductive pins may also include other functional pins as long as they are compatible with the adopted connection standard. Further, in an exemplary embodiment, the connection interface 1311 can also include at least one conductive pin. The number of the conductive pins in the connection interface 1311 may be identical to or different from the number of the conductive pins in the connection interface 1312.

Figure 2:
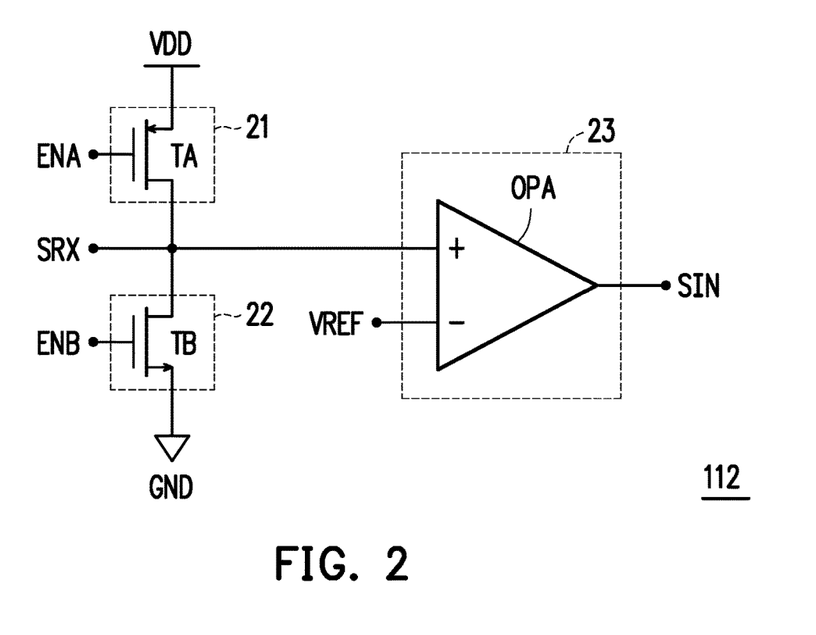
FIG. 2 is a schematic diagram illustrating a memory interface circuit according to an exemplary embodiment of the disclosure.

FIG. 2 is a schematic diagram illustrating a memory interface circuit according to an exemplary embodiment of the disclosure. With reference to FIG. 1 and FIG. 2, the memory interface circuit 112 receives a signal SRX (a.k.a. a first signal) from the volatile memory 12. Then, the memory interface circuit 112 analyzes the signal SRX and generates a signal SIN (a.k.a. an input signal). For example, according to the signal state of the signal SIN, the memory controller 111 can identify the bit data represented by the signal SRX to be "0" or "1".

In the present exemplary embodiment, the memory interface circuit 112 includes an impedance component 21, an impedance component 22 and a comparison circuit 23. The comparison circuit 23 is coupled to the impedance component 21 and the impedance component 22. A first terminal of the impedance component 21 is coupled to a reception path of the signal SRX, and a second terminal of the impedance component 21 is coupled to a supply voltage VDD of the memory interface circuit 112. In addition, a first terminal of the impedance component 22 is also coupled to the reception path of the signal SRX, and a second terminal of the impedance component 22 is coupled to a reference ground voltage GND of the memory interface circuit 112. From another perspective, the impedance components 21 and 22 are connected in series between the supply voltage VDD and the reference ground voltage GND of the memory interface circuit 112.

The impedance components 21 and 22 are configured to provide impedances to the reception path of the signal SRX. In the present exemplary embodiment, the impedances provided by the impedance components 21 and 22 are also known as an internal impedance of the memory interface circuit 112. For example, the internal impedance can include a resistance value or reactance value. In the present exemplary embodiment, the impedances provided by the impedance components 21 and 22 have the same (or similar) resistance value or reactance value. In another exemplary embodiment, the impedance provided by the impedance component 21 and the impedance provided by the impedance component 22 have different resistance values or reactance values. In an exemplary embodiment, at least one of the impedance components 21 and 22 is also known as an ODT (on-die termination) impedance component of the memory interface circuit 112.

In the present exemplary embodiment, the impedance component 21 includes at least one transistor TA, and the impedance component 22 includes at least one transistor TB. The transistors TA and TB can commonly or separately provide an equivalent impedance of the internal impedance. However, in another exemplary embodiment, each of the impedance components 21 and 22 may also include at least one electronic component capable of providing the resistance value or the reactance value, such as a resistor.

In the present exemplary embodiment, a third terminal of the impedance component 21 is configured to receive a signal ENA, and a third terminal of the impedance component 22 is configured to receive a signal ENB. The signal ENA is an enabling signal for activating the impedance component 21, and the signal ENB is an enabling signal for activating the impedance component 22. Upon receiving the signal ENA, the impedance component 21 is activated. If the impedance component 21 is activated, a path (a.k.a. a first impedance path) between the reception path of the signal SRX and the supply voltage VDD is turned on, so the signal SRX is affected by the impedance provided by the impedance component 21. Conversely, if the signal ENA is not received, the impedance component 21 is not activated and the signal SRX is unaffected by the impedance provided by the impedance component 21. In other words, the impedance component 21 can provide the internal impedance to the reception path of the signal SRX in response to the signal ENA.

On the other hand, upon receiving the signal ENB, the impedance component 22 is activated. If the impedance component 22 is activated, a path (a.k.a. a second impedance path) between the reception path of the signal SRX and the reference ground voltage GND is turned on, so the signal SRX is affected by the impedance provided by the impedance component 22. Conversely, if the signal ENB is not received, the impedance component 22 is not activated and the signal SRX is unaffected by the impedance provided by the impedance component 22. In other words, the impedance component 22 can provide the internal impedance to the reception path of the signal SRX in response to the signal ENB.

In an exemplary embodiment, if only one of the impedance components 21 and 22 is activated (e.g., the impedance component 21 is activated and the impedance component 22 is not activated or the impedance component 21 is not activated and the impedance component 22 is activated), the memory interface circuit 112 is considered as being operated (or acting) based on a first mode. In an exemplary embodiment, if the impedance components 21 and 22 are both activated, the memory interface circuit 112 is considered as being operated (or acting) based on a second mode.

In an exemplary embodiment, the memory interface circuit 112 acts based on the first mode (e.g., only one of the impedance components 21 and 22 is activated) if the volatile memory 12 is the DDR 4 SDRAM. In an exemplary embodiment, the memory interface circuit 112 acts based on the second mode (e.g., the impedance components 21 and 22 are both activated) if the volatile memory 12 is the DDR 3 SDRAM.

Figure 3:
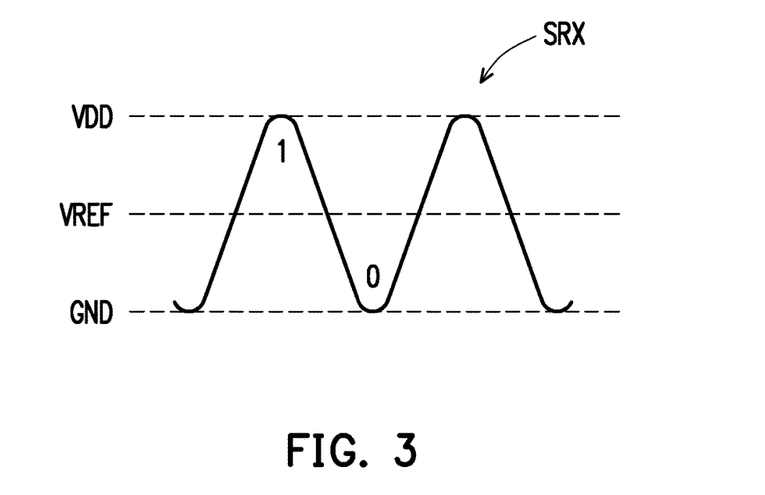
FIG. 3 is a schematic diagram illustrating a first signal according to an exemplary embodiment of the disclosure.

FIG. 3 is a schematic diagram illustrating a first signal according to an exemplary embodiment of the disclosure. With reference to FIG. 2 and FIG. 3, if the impedance components 21 and 22 are both in an activated state (i.e., if the signals ENA and ENB coexist) within a specific time range, in response to the impedances commonly provided by the impedance components 21 and 22, a voltage value of the signal SRX is adjusted to a voltage range (a.k.a. a default voltage range). An upper threshold voltage of the default voltage range approaches (or is equal to) a voltage value of the supply voltage VDD, and a lower threshold voltage of the default voltage range approaches (or is equal to) a voltage value of the reference ground voltage GND, as shown by FIG. 3. In other words, as being affected by the impedances commonly provided by the impedance components 21 and 22, the voltage value of the signal SRX rises and falls between the voltage value of the supply voltage VDD and the voltage value of the reference ground voltage GND. However, it should be noted that, the voltage value of the signal SRX is not higher than the voltage value of the supply voltage VDD or lower than the voltage value of the reference ground voltage GND.

On the other hand, one signal VREF (a.k.a. an internal reference voltage) is configured to determine whether the current signal SRX is used to transfer the bit "1" or "0". For example, in the exemplary embodiment of FIG. 3, a voltage value of the signal VREF is (approximately) equal to a central value (a.k.a. a default voltage value) between the voltage value of the supply voltage VDD and the voltage value of the reference ground voltage GND. For example, the default voltage value is (approximately) one half a sum of the voltage value of the supply voltage VDD and the voltage value of the reference ground voltage GND. If the voltage value of the current signal SRX is higher than the voltage value of the signal VREF, it indicates that the current signal SRX is used to transfer the bit "1". If the voltage value of the current signal SRX is lower than the voltage value of the signal VREF, it indicates that the current signal SRX is used to transfer the bit "0".

It should be noted that, in another exemplary embodiment of FIG. 3, if the voltage value of the current signal SRX is higher than the voltage value of the signal VREF, the current signal SRX may also be regarded as being used to transfer the bit "0". If the voltage value of the current signal SRX is lower than the voltage value of the signal VREF, the current signal SRX may also be regarded as being used to transfer the bit "1".

Specifically, the memory interface circuit 112 generates the signal SIN according to a voltage correspondence between the signal SRX and the signal VREF. For example, the comparison circuit 23 may include an operational amplifier (OPA). The comparison circuit 23 receives the signal SRX and the signal VREF and compares the voltage values of the signal SRX and the signal VREF. By comparing the voltage values of the signal SRX and the signal VREF, the voltage correspondence between the signal SRX and the signal VREF can be obtained. If the voltage correspondence between the signal SRX and the signal VREF shows that the voltage value of the signal SRX is higher than the voltage value of the signal VREF, the signal SIN corresponding to one specific bit data (e.g., the bit "1") is outputted. If the voltage correspondence between the signal SRX and the signal VREF shows that the voltage value of the signal SRX is lower than the voltage value of the signal VREF, the signal SIN corresponding to another specific bit data (e.g., the bit "0") is outputted. In other words, according to the voltage correspondence between the signal SRX and the signal VREF, the bit data transferred by the signal SRX can be obtained.

In the present exemplary embodiment, the memory interface circuit 112 also dynamically generates the signal VREF according to the impedance (i.e., the internal impedance) currently provided by the memory interface circuit 112 and the impedance (a.k.a. an external impedance) provided by the volatile memory 12. For example, the volatile memory 12 is also disposed with at least one impedance component, which is configured to provide said external impedance. In an exemplary embodiment, the impedance component in the volatile memory 12 for providing the external impedance is also known as an OCD (off-chip driver) impedance component. More specifically, in the exemplary embodiment of FIG. 3, the signal SRX from the volatile memory 12 is actually affected by both the internal impedance of the memory interface circuit 112 and the external impedance of the volatile memory 12, so the voltage value of the signal SRX is adjusted to the default voltage range of FIG. 3.

In an exemplary embodiment, if intending to generate the signal VREF, the volatile memory 12 transmits a signal meeting a specific condition (a.k.a. a second signal) to the memory interface circuit 112. The memory interface circuit 112 receives the second signal from the reception path of the signal SRX. In other words, the second signal can also be affected by the internal impedance of the memory interface circuit 112 and the external impedance of the volatile memory 12. Then, the memory interface circuit 112 performs a voltage division on the second signal so as to generate the signal VREF.

In an exemplary embodiment, the second signal refers to a signal for transmitting at least one specific bit. For example, in an exemplary embodiment, the specific bits is the bit "0", and thus a voltage value of the second signal is identical (or approaches) to the lower threshold voltage of the default voltage range in FIG. 3. Then, by performing the voltage division on the second signal according to the promptly detected supply voltage VDD, the signal VREF can be dynamically generated.

Figure 4:
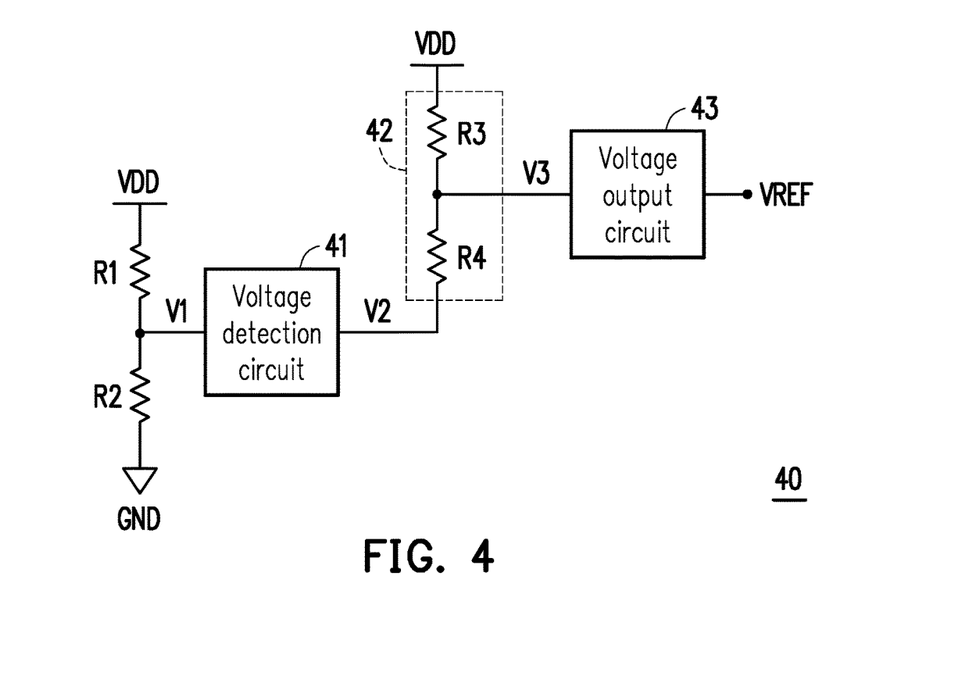
FIG. 4 is a schematic diagram illustrating a reference voltage generating circuit according to an exemplary embodiment of the disclosure.

FIG. 4 is a schematic diagram illustrating a reference voltage generating circuit according to an exemplary embodiment of the disclosure. With reference to FIG. 1 to FIG. 4, in an exemplary embodiment, the memory interface circuit 112 also includes a reference voltage generating circuit (a.k.a. a reference voltage generator) 40, which is coupled to the connection interfaces 1311 and 1312. For example, an input terminal of the reference voltage generating circuit 40 is coupled to the reception path of the signal SRX, and an output terminal of the reference voltage generating circuit 40 is coupled to the comparison circuit 23. Accordingly, the reference voltage generating circuit 40 can detect the internal impedance of the memory interface circuit 112 through the connection interface 1311, detect the external impedance of the volatile memory 12 through the connection interface 1312, and then generate the signal VREF according to a detection result.

In the exemplary embodiment of FIG. 4, the reference voltage generating circuit 40 includes a voltage detection circuit 41, a voltage division circuit 42 and a voltage output circuit 43. If the memory interface circuit 112 is coupled to the volatile memory 12, the voltage detection circuit 41 is coupled between an impedance component R1 and an impedance component R2. Among them, the impedance component R1 represents an equivalent resistance of the internal impedance of the memory interface circuit 112, and the impedance component R2 represents an equivalent resistance of the external impedance of the volatile memory 12.

If the second signal is received by the memory interface circuit 112, the voltage detection circuit 41 detects a signal V1 (i.e., the second signal) between the impedance component R1 and the impedance component R2 in response to the internal impedance provided by the impedance component R1 and the external impedance provided by the impedance component R2, and then generates a signal V2. In an exemplary embodiment, the signal V1 refers to a voltage (a.k.a. a first voltage) at one terminal of the impedance component R1, and a voltage value of the first voltage is positively correlated to the voltage value of the supply voltage VDD at another terminal of the impedance component R1. In addition, the signal V2 is also known as a second voltage. For example, a voltage value of the signal V2 is latched at the voltage value of the signal V1. For example, the voltage value of the signal V2 is identical (or approaches) to the voltage value of the signal V1. Take FIG. 3 for example, the voltage value of the signal V2 is identical (or approaches) to the lower threshold voltage of the default voltage range.

The voltage division circuit 42 is coupled to the voltage detection circuit 41 and configured to perform a voltage division on the signal V2 at an output terminal of the voltage detection circuit 41. For example, the voltage division circuit 42 includes impedance components R3 and R4. A first terminal of the impedance component R3 is coupled to the supply voltage VDD, a first terminal of the impedance component R4 is coupled to the voltage detection circuit 41 to receive the signal V2, and a second terminal of the impedance component R3 is coupled to a second terminal of the impedance component R4. In addition, the impedance components R3 and R4 provide the same (or similar) impedance value. The voltage division circuit 42 performs the voltage division according to the supply voltage VDD and the signal V2 and generate a signal V3 (a.k.a. a third voltage). A voltage value of the signal V3 is (approximately) equal to one half a sum of the voltage value of the supply voltage VDD and the voltage value of the signal V2.

The voltage output circuit 43 is coupled to the voltage division circuit 42 and generates the signal VREF in response to the signal V3 at an output terminal of the voltage division circuit 42. For example, the voltage value of the signal VREF may be locked at the voltage value of the signal V3. For example, the voltage value of the signal VREF may be identical (or approaches) to the voltage value of the signal V3. Then, the signal VREF can be provided to the comparison circuit 23 of FIG. 2. Further, in an exemplary embodiment, the voltage value or generation parameters of the signal VREF may be stored in a storage device such as a register. By doing so, after receiving of the second signal is stopped, the voltage output circuit 43 (or the memory interface circuit 112) can still continually generate the signal VREF according to the recorded voltage value or the generation parameters. Moreover, in an exemplary embodiment, after receiving of the second signal is stopped, at least one of the voltage detection circuit 41 and the voltage division circuit 42 can be disabled for saving power.

In an exemplary embodiment, the operation of generating the signal VREF according to the second signal may also be considered as an operation for generating an internal reference signal. For example, this operation for generating the internal reference signal can be performed before actually generating the signal SIN by using the signal VREF and configured to dynamically determine the voltage value of the signal VREF. That is to say, in an exemplary embodiment, before receiving the first signal, the memory interface circuit 112 can receive the second signal and determine, according to the second signal, a voltage value of the internal reference signal to be subsequently used in analyzing the first signal.

In an exemplary embodiment, the memory controller 111 sends at least one default read command to the volatile memory 12 via the memory interface circuit 112. The default read command is configured to instruct reading a default data of the volatile memory 12. The default data includes at least one specific bit (e.g., the bit "0"). According to the default read command, the volatile memory 12 can generate the second signal.

In an exemplary embodiment, according to the default read command, the volatile memory 12 automatically stores the default data and continually performs the operation of reading the default data in order to generate said second signal. In this way, before the default read command is sent, the memory controller 111 will not send additional write command to instruct storing the default data into the volatile memory 12. Further, in an exemplary embodiment, according to the default read command, the volatile memory 12 can generate said second signal without actually performing the data access operation. Alternatively, in another exemplary embodiment, the memory controller 111 may send an additional write command which instructs to store the default data into the volatile memory 12 before the default read command is sent, which is not particularly limited by the disclosure.

In an exemplary embodiment, only one of the impedance components 21 and 22 is activated. For example, within a specific time range, if the signal ENA exists and the impedance component 21 is activated, then the signal ENB does not exist. In this case, the activated impedance component 21 can provide the internal impedance to the reception path of the signal SRX, whereas the non-activated impedance component 22 does not provide the internal impedance. Alternatively, within a specific time range, if the signal ENB exists and the impedance component 22 is activated, then the signal ENA does not exist. In this case, the activated impedance component 22 can provide the internal impedance to the reception path of the signal SRX, whereas the non-activated impedance component 21 does not provide the internal impedance. By activating only one of the impedance components 21 and 22, a power consumption of the memory interface circuit 112 if receiving the signal SRX can be reduced.

In an exemplary embodiment, an enabling time of the signals ENA or ENB can also be dynamically adjusted. For example, the enabling time of the signals ENA or ENB may be positively correlated to a total number of bits sequentially transmitted through the signal SRX. It should be noted that, the enabling time refers to an existing time of the signal. For example, the enabling time of the signal ENA is positively correlated to a time length of the impedance component 21 in the activated state, and the enabling time of the signal ENB is positively correlated to a time length of the impedance component 22 in the activated state.

In an exemplary embodiment, it is assumed that a transmission specification of the signal SRX is to sequentially transmit n bits of bit data. For example, n may be 4, 8, 16 or 32, or greater or smaller. If n is greater, the enabling time of the signals ENA or ENB is longer. Accordingly, it can be ensured that, before the bit data is completely received from the volatile memory 12, (at least) one of the impedance components 21 and 22 constantly stays in the activated state. After the bit data is completely received from the volatile memory 12, providing of the signals ENA and ENB can be stopped. In this way, the power consumption of the memory interface circuit 112 if receiving the signal SRX can be further reduced.

In an exemplary embodiment, only one of the impedance components 21 and 22 is disposed in the memory interface circuit 112. By doing so, not only the power consumption of the memory interface circuit 112 if receiving the signal SRX can be reduced, a layout area for the receiver circuit in the memory interface circuit 112 can also be reduced.

Figure 5:
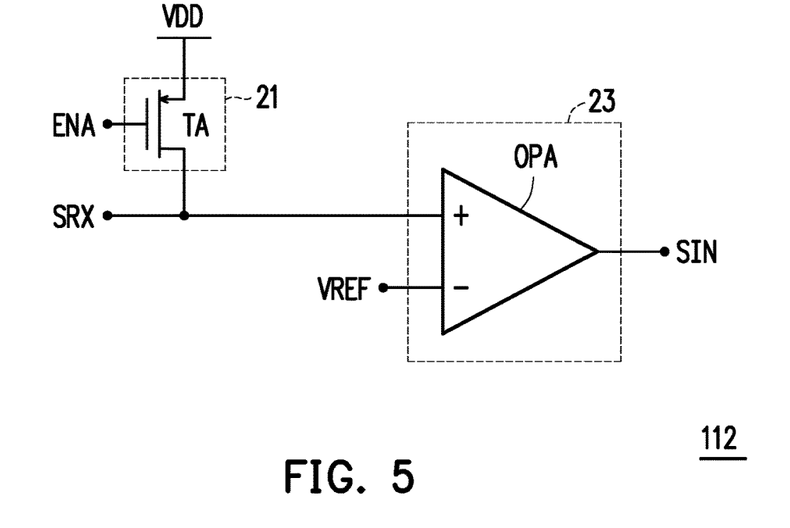
FIG. 5 is a schematic diagram illustrating a memory interface circuit according to another exemplary embodiment of the disclosure.
Figure 6:
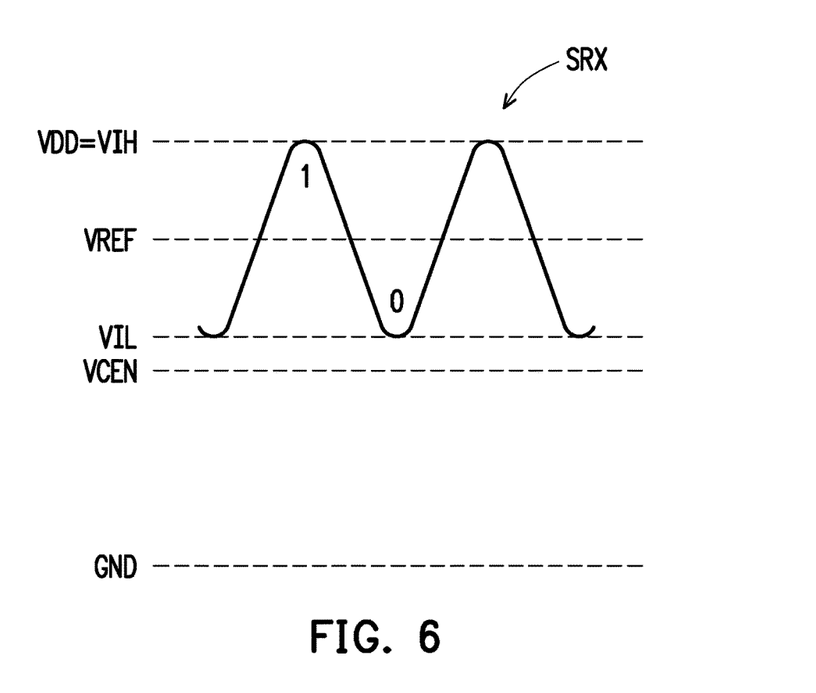
FIG. 6 is a schematic diagram illustrating a first signal according to another exemplary embodiment of the disclosure.

FIG. 5 is a schematic diagram illustrating a memory interface circuit according to another exemplary embodiment of the disclosure. FIG. 6 is a schematic diagram illustrating a first signal according to another exemplary embodiment of the disclosure. With reference to FIG. 5 and FIG. 6, in the present exemplary embodiment, the memory interface circuit 112 is disposed with the impedance component 21 but without the impedance component 22. The voltage value of the signal SRX is adjusted to one voltage range (a.k.a. a first voltage range) in response to the internal impedance provided by the impedance component 21. The first voltage range has an upper threshold voltage VIH (a.k.a. a first threshold voltage) and a lower threshold voltage VIL (a.k.a. a second threshold voltage). A voltage value of the upper threshold voltage VIH is higher than a voltage value of the lower threshold voltage VIL. In other words, in the exemplary embodiment of FIG. 5 and FIG. 6, the voltage value of the signal SRX is affected by the internal impedance provided by the impedance component 21 and thus rises and falls within the first voltage range depending on the transmitted bit data. Further, in an exemplary embodiment of FIG. 5 and FIG. 6, the voltage value of the signal SRX does not exceed the first voltage range.

It should be noted that, in the exemplary embodiment of FIG. 5 and FIG. 6, the first voltage range is different from the default voltage range in FIG. 3, and a central value of the first voltage range is different from a voltage value of a default voltage VCEN. For example, the central value of the first voltage range may be higher than the voltage value of the default voltage VCEN. Here, the central value of the first voltage range is equal to one half a sum of the voltage value of the upper threshold voltage VIH and the voltage value of the lower threshold voltage VIL, and the voltage value of the default voltage VCEN (i.e., the default voltage value) is equal to one half the sum of the voltage value of the supply voltage VDD and the voltage value of the reference ground voltage GND. Moreover, the voltage value of the upper threshold voltage VIH may be identical (or approaches) to the voltage value of the supply voltage VDD. It should be noted that, although the voltage value of the lower threshold voltage VIL is illustrated as being higher than the voltage value of the default voltage VCEN in FIG. 6, however, in another exemplary embodiment of FIG. 6, the voltage value of the lower threshold voltage VIL may also be lower than the voltage value of the default voltage VCEN, depending on the configured internal impedance and the external impedance.

In the exemplary embodiment of FIG. 5 and FIG. 6, the signal VREF is also dynamically generated by the memory interface circuit 112. For example, according to the exemplary embodiment of FIG. 4, the voltage value of the signal V2 (or the signal V1) is identical (or approaches) to the voltage value of the lower threshold voltage VIL in FIG. 6. After the voltage division is performed according to the signal V2 and the supply voltage VDD, the signal VREF can be generated. For example, the voltage value of the signal VREF is identical (or approaches) to the central value of the first voltage range, as shown by FIG. 6. Specific details regarding how to generate the signal VREF can refer to the foregoing description, which is not repeated hereinafter.

Further, in another exemplary embodiment of FIG. 5, the impedance component 21 may also be implemented by at least one electronic component capable of providing the resistance value or the reactance value, such as a resistor. In this way, the impedance component 21 can continuously provide the internal impedance to the reception path of the signal SRX without being controlled by the signal ENA.

Figure 7:
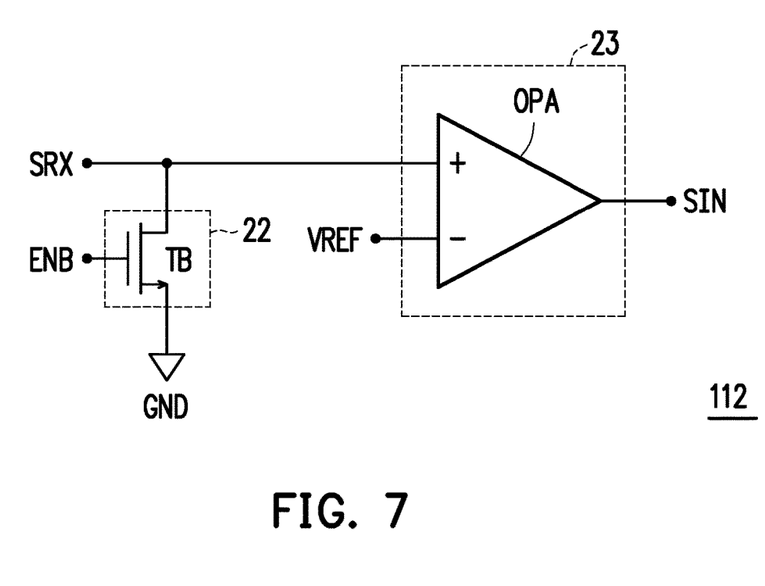
FIG. 7 is a schematic diagram illustrating a memory interface circuit according to another exemplary embodiment of the disclosure.
Figure 8:
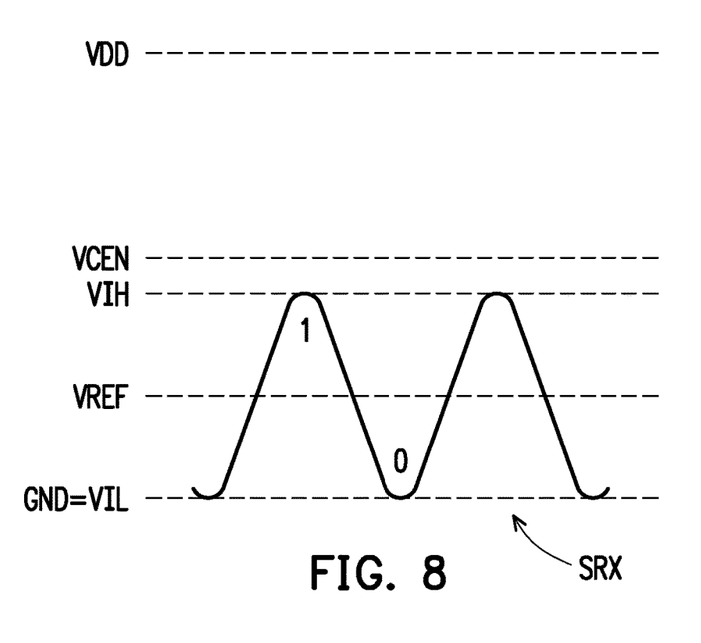
FIG. 8 is a schematic diagram illustrating a first signal according to another exemplary embodiment of the disclosure.

FIG. 7 is a schematic diagram illustrating a memory interface circuit according to another exemplary embodiment of the disclosure. FIG. 8 is a schematic diagram illustrating a first signal according to another exemplary embodiment of the disclosure. With reference to FIG. 7 and FIG. 8, in the present exemplary embodiment, the memory interface circuit 112 is disposed with the impedance component 22 but without the impedance component 21. The voltage value of the signal SRX is adjusted to another voltage range (a.k.a. a second voltage range) in response to the internal impedance provided by the impedance component 22. The second voltage range also has one upper threshold voltage VIH and one lower threshold voltage VIL. A voltage value of the upper threshold voltage VIH is higher than a voltage value of the lower threshold voltage VIL. In other words, in the exemplary embodiment of FIG. 7 and FIG. 8, the voltage value of the signal SRX is affected by the internal impedance provided by the impedance component 22 and thus rises and falls within the second voltage range depending on the transmitted bit data. Further, in an exemplary embodiment of FIG. 7 and FIG. 8, the voltage value of the signal SRX does not exceed the second voltage range.

It should be noted that, in the exemplary embodiment of FIG. 7 and FIG. 8, the second voltage range is different from the default voltage range in FIG. 3, and a central value of the second voltage range is different from the voltage value of the default voltage VCEN. Here, the central value of the second voltage range is equal to one half the sum of the voltage values of the upper threshold voltage VIH and the lower threshold voltage VIL. For example, the central value of the second voltage range may be lower than the voltage value of the default voltage VCEN. Moreover, the voltage value of the lower threshold voltage VIL may be identical (or approaches) to the voltage value of the reference ground voltage GND. It should be noted that, although the voltage value of the upper threshold voltage VIH is illustrated as being lower than the voltage value of the default voltage VCEN in FIG. 8, however, in another exemplary embodiment of FIG. 8, the voltage value of the upper threshold voltage VIH may also be higher than the voltage value of the default voltage VCEN, depending on the configured internal impedance and the external impedance.

In the exemplary embodiment of FIG. 7 and FIG. 8, the signal VREF is also dynamically generated by the memory interface circuit 112. For example, according to the exemplary embodiment of FIG. 4, the voltage value of the signal V2 (or the signal V1) is identical (or approaches) to the voltage value of the upper threshold voltage VIH in FIG. 8. If the supply voltage VDD coupled to the voltage division circuit 42 is replaced by the reference ground voltage GND, the signal VREF can be generated after the voltage division is performed according to the signal V2 and the reference ground voltage GND. For example, the voltage value of the signal VREF is identical (or approaches) to the central value of the second voltage range, as shown by FIG. 8.

Further, in another exemplary embodiment of FIG. 7, the impedance component 22 may also be implemented by at least one electronic component capable of providing the resistance value or the reactance value, such as a resistor. In this way, the impedance component 22 can continuously provide the internal impedance to the reception path of the signal SRX without being controlled by the signal ENB.

Figure 9:
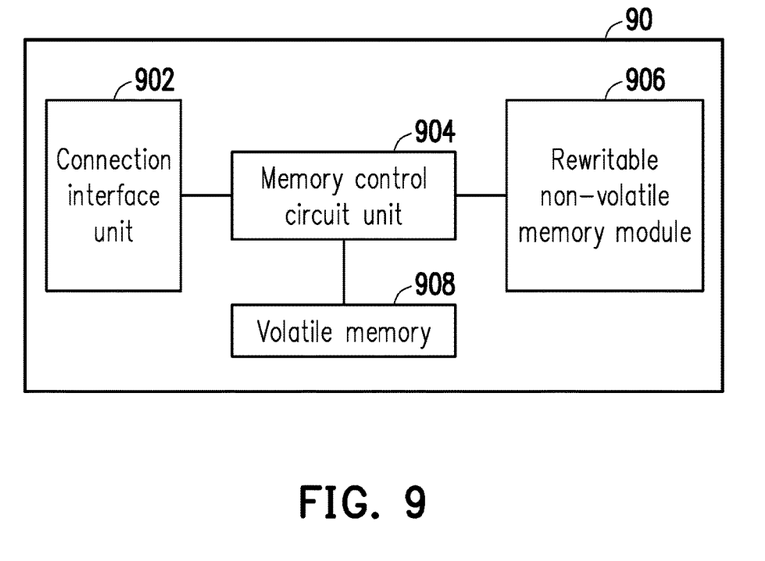
FIG. 9 is a schematic diagram illustrating a memory storage device according to another exemplary embodiment of the disclosure.

FIG. 9 is a schematic diagram illustrating a memory storage device according to another exemplary embodiment of the disclosure. With reference to FIG. 9, a memory storage device 90 is a memory storage device including both a rewritable non-volatile memory module 906 and a volatile memory 908, such as a SSD (Solid State Drive). The memory storage device 90 can be used together with a host system so the host system can write data into the memory storage device 90 or read data from the memory storage device 90. Aforementioned host system may be any systems capable of substantially cooperating with the memory storage device 90 for storing data, such as a desktop computer, a notebook computer, a digital camera, a video camera, a communication device, an audio player, a video player or a tablet computer.

Specifically, the memory storage device 90 includes a connection interface unit 902, a memory control circuit unit 904, the rewritable non-volatile memory module 906 and the volatile memory 908. The connection interface unit 902 is configured to connect the memory storage device 90 to the host system. In the present exemplary embodiment, the connection interface unit 902 is compatible with a serial advanced technology attachment (SATA) standard. Nevertheless, it should be understood that the disclosure is not limited thereto. The connection interface unit 902 may also be compatible with a PATA (Parallel Advanced Technology Attachment) standard, a PCI Express (Peripheral Component Interconnect Express) interface standard, a USB (Universal Serial Bus) standard or other suitable standards. The connection interface unit 902 can be packaged into one chip with the memory control circuit unit 904, or the connection interface unit 902 can also be distributed outside of a chip containing the memory control circuit unit 904.

The memory control circuit unit 904 is configured to perform operations of writing, reading or erasing data in the rewritable non-volatile memory module 906 according to the control commands from the host system. The rewritable non-volatile memory module 906 is coupled to the memory control circuit unit 904 and configured to store data written from the host system. The rewritable non-volatile memory module 906 may be a SLC (Single Level Cell) NAND flash memory module (i.e., a flash memory module capable of storing one bit in one memory cell), a MLC (Multi Level Cell) NAND flash memory module (i.e., a flash memory module capable of storing two bits in one memory cell), a TLC (Triple Level Cell) NAND flash memory module (i.e., a flash memory module capable of storing three bits in one memory cell), other flash memory modules or any memory module having the same features.

In the present exemplary embodiment, the memory control circuit unit 904 also includes functions and/or electronic circuit structures identical or similar to the memory control circuit unit 11 mentioned in the exemplary embodiments of FIG. 1 to FIG. 8, and the volatile memory 908 is identical or similar to the volatile memory 12 mentioned in the exemplary embodiment of FIG. 1. Therefore, description regarding the memory control circuit unit 904 and the volatile memory 908 can refer to the exemplary embodiments of FIG. 1 to FIG. 8, which are not repeated hereinafter.

It should be noted that, electronic circuit structures illustrated in FIG. 2, FIG. 4, FIG. 5 and FIG. 7 are schematic drawings of the memory interface circuit in some of the exemplary embodiments instead of limitations to the disclosure. In some of non-mentioned embodiments, more electronic elements may be added to the memory interface circuit to provide additional functions. Moreover, in some of non-mentioned embodiments, a circuit layout and/or coupling relation between elements may also be properly altered to meet practical requirements.

Figure 10:
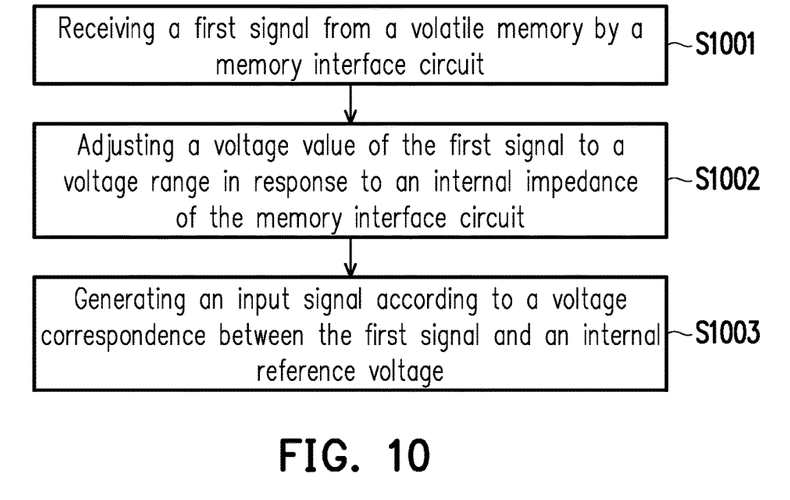
FIG. 10 is a flowchart illustrating a signal receiving method according to an exemplary embodiment of the disclosure.

FIG. 10 is a flowchart illustrating a signal receiving method according to an exemplary embodiment of the disclosure. The signal receiving method is applicable to the memory storage device mentioned in the exemplary embodiments of FIG. 1 or FIG. 9. Description will be provided below using the memory storage device 10 of FIG. 1 with reference to FIG. 10.

Referring to FIG. 1 and FIG. 10, in step S1001, a first signal from the volatile memory 12 is received by the memory interface circuit 112. In step S1002, a voltage value of the first signal is adjusted to a voltage range by the memory interface circuit 112 in response to an internal impedance of the memory interface circuit 112. As an example, the voltage range may be the first voltage range shown by FIG. 6 or the second voltage range shown by FIG. 8. In step S1003, an input signal is generated by the memory interface circuit 112 according to a voltage correspondence between the first signal and an internal reference voltage.

Nevertheless, steps depicted in FIG. 10 are described in detail as above so that related description thereof is omitted hereinafter. It should be noted that, the steps depicted in FIG. 10 may be implemented as a plurality of program codes or circuits, which are not particularly limited in the disclosure. Moreover, the method disclosed in FIG. 10 may be implemented by reference with above exemplary embodiments, or may be implemented separately, which are not particularly limited in the disclosure.

In summary, the disclosure proposes a specific receiver circuit to be disposed in the memory interface circuit for adjusting the voltage value of the first signal from the volatile memory to one specific voltage range and using the suitable internal reference voltage to analyze the first signal. As a result, correctness of the generated input signal can be maintained while reducing the power consumption if receiving the first signal.

The previously described exemplary embodiments of the present disclosure have the advantages aforementioned, wherein the advantages aforementioned not required in all versions of the disclosure.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A memory control circuit unit, configured to control a volatile memory, and the memory control circuit unit comprising:
   a memory controller; and
   a memory interface circuit, coupled to the memory controller,
   wherein the memory interface circuit is configured to receive a first signal from the volatile memory,
   wherein the memory interface circuit is further configured to adjust a voltage value of the first signal to a voltage range in response to an internal impedance of the memory interface circuit,
   wherein the memory interface circuit is further configured to generate an input signal according to a voltage correspondence between the first signal and an internal reference voltage,
   wherein the memory interface circuit comprises a first impedance component and a second impedance component configured to provide the internal impedance,
   wherein the memory interface circuit is further configured to act based on a first mode if the first impedance component is activated and the second impedance component is not activated,
   wherein the memory interface circuit is further configured to act based on a second mode if the first impedance component is activated and the second impedance component is activated,
   wherein a voltage value of the internal reference voltage which is used if the memory interface circuit is acted based on the first mode does not equal to a first voltage value,
   wherein the first voltage value is a voltage value of the internal reference voltage which is used if the memory interface circuit is acted based on the second mode.

2. The memory control circuit unit according to claim 1, wherein the voltage value of the internal reference voltage which is used if the memory interface circuit is acted based on the second mode is one half a sum of a voltage value of a supply voltage of the memory interface circuit and a voltage value of a reference ground voltage.

3. The memory control circuit unit according to claim 1, wherein the memory interface circuit is further configured to determine the internal reference voltage according to a central value of the voltage range.

4. The memory control circuit unit according to claim 1, wherein the memory interface circuit is configured to couple to the volatile memory,
   wherein the memory interface circuit is further configured to act based on the first mode if the volatile memory is a Double Data Rate 4 Synchronous Dynamic Random Access Memory.

5. The memory control circuit unit according to claim 4, wherein the memory interface circuit is further configured to act based on the second mode if the volatile memory is a Double Data Rate 3 Synchronous Dynamic Random Access Memory.

6. The memory control circuit unit according to claim 1, wherein a first terminal of the first impedance component is coupled to a reception path of the first signal, a first terminal of the second impedance component is coupled to the reception path of the first signal, a second terminal of the first impedance component is coupled to one of the supply voltage and the reference ground voltage, and a second terminal of the second impedance component is coupled to the other one of the supply voltage and the reference ground voltage.

7. The memory control circuit unit according to claim 6, wherein a third terminal of the second impedance component is configured to receive an enabling signal, and the second impedance component is activated in response to the enabling signal.

8. The memory control circuit unit according to claim 7, wherein an enabling time of the enabling signal is positively correlated to a total number of bits sequentially transmitted through the first signal.

9. The memory control circuit unit according to claim 1, wherein the memory interface circuit is further configured to receive a second signal form the volatile memory before receiving the first signal,
   wherein the memory interface circuit is further configured to perform a voltage division on the second signal so as to generate the internal reference voltage.

10. The memory control circuit unit according to claim 9, wherein the memory interface circuit is further configured to send a default read command sequence to instruct reading a default data of the volatile memory,
    wherein the volatile memory is configured to generate the second signal according to the default read command sequence.

11. The memory control circuit unit according to claim 1, wherein the memory interface circuit comprises a comparison circuit,
    wherein the comparison circuit is configured to compare the internal reference voltage with the voltage value of the first signal so as to generate the input signal.

12. The memory control circuit unit according to claim 1, wherein the volatile memory is configured to provide an external impedance,
    wherein the voltage value of the first signal is further adjusted to the voltage range in response to the external impedance.

13. The memory control circuit unit according to claim 1, wherein the memory interface circuit comprises:
    a first connection interface, configured to couple to the memory controller;
    a second connection interface, configured to couple to the volatile memory; and
    a reference voltage generator, coupled to the first connection interface and the second connection interface,
    wherein the reference voltage generator is configured to detect the internal impedance through the first connection interface, detect an external impedance of the volatile memory through the second connection interface and generate the internal reference voltage according to a detection result.

14. The memory control circuit unit according to claim 13, wherein the reference voltage generator comprises:
    a voltage detection circuit, configured to detect a first voltage in response to the internal impedance and the external impedance,
    wherein a voltage value of the first voltage is positively correlated to the voltage value of the supply voltage.

15. The memory control circuit unit according to claim 14, wherein the reference voltage generator further comprises:
    a voltage division circuit, coupled to the voltage detection circuit and configured to perform a voltage division on a second voltage at an output terminal of the voltage detection circuit; and
    a voltage output circuit, coupled to the voltage division circuit and configured to generate the internal reference voltage in response to a third voltage at an output terminal of the voltage division circuit.

16. A memory storage device, comprising:
a connection interface unit, configured to couple to a host system;
a rewritable non-volatile memory module;
a volatile memory;
a memory control circuit unit, coupled to the connection interface unit, the rewritable non-volatile memory module and the volatile memory,
wherein the memory control circuit unit is configured to receive a first signal from the volatile memory,
wherein the memory control circuit unit is further configured to adjust a voltage value of the first signal to a voltage range in response to an internal impedance of the memory control circuit unit,
wherein the memory control circuit unit is further configured to generate an input signal according to a voltage correspondence between the first signal and an internal reference voltage,
wherein the memory control circuit unit comprises a first impedance component and a second impedance component configured to provide the internal impedance,
wherein the memory control circuit unit is further configured to act based on a first mode if the first impedance component is activated and the second impedance component is not activated,
wherein the memory control circuit unit is further configured to act based on a second mode if the first impedance component is activated and the second impedance component is activated,
wherein a voltage value of the internal reference voltage which is used if the memory control circuit unit is acted based on the first mode does not equal to a first voltage value,
wherein the first voltage value is a voltage value of the internal reference voltage which is used if the memory control circuit unit is acted based on the second mode.

17. The memory storage device according to claim 16, wherein the voltage value of the internal reference voltage which is used if the memory control circuit unit is acted based on the second mode is one half a sum of a voltage value of a supply voltage of the memory control circuit unit and a voltage value of a reference ground voltage.

18. The memory storage device according to claim 16, wherein the memory control circuit unit is further configured to determine the internal reference voltage according to a central value of the voltage range.

19. The memory storage device according to claim 16, wherein the memory control circuit unit is further configured to act based on the first mode if the volatile memory is a Double Data Rate 4 Synchronous Dynamic Random Access Memory.

20. The memory storage device according to claim 19, wherein the memory control circuit unit is further configured to act based on the second mode if the volatile memory is a Double Data Rate 3 Synchronous Dynamic Random Access Memory.

21. A signal receiving method for a memory storage device having a volatile memory, and the signal receiving method comprising:
receiving a first signal from the volatile memory by a memory interface circuit;
adjusting a voltage value of the first signal to a voltage range in response to an internal impedance of the memory interface circuit;
generating an input signal according to a voltage correspondence between the first signal and an internal reference voltage;
operating the memory interface circuit based on a first mode if a first impedance component of the memory interface circuit is activated and a second impedance component of the memory interface circuit is not activated; and
operating the memory interface circuit based on a second mode if the first impedance component is activated and the second impedance component is activated,
wherein a voltage value of the internal reference voltage which is used if the memory interface circuit is operated based on the first mode does not equal to a first voltage value,
wherein the first voltage value is a voltage value of the internal reference voltage which is used if the memory interface circuit is operated based on the second mode.

22. The signal receiving method according to claim 21, wherein the voltage value of the internal reference voltage which is used if the memory interface circuit is operated based on the second mode is one half a sum of a voltage value of a supply voltage of the memory interface circuit and a voltage value of a reference ground voltage.

23. The signal receiving method according to claim 21, further comprising:
determining the internal reference voltage according to a central value of the voltage range.

24. The signal receiving method according to claim 21, further comprising:
operating the memory interface circuit based on the first mode if the volatile memory is a Double Data Rate 4 Synchronous Dynamic Random Access Memory.

25. The signal receiving method according to claim 24, further comprising:
operating the memory interface circuit based on the second mode if the volatile memory is a Double Data Rate 3 Synchronous Dynamic Random Access Memory.

* * * * *